United States Patent
Pei et al.

(10) Patent No.: US 9,524,956 B2
(45) Date of Patent: Dec. 20, 2016

(54) INTEGRATED FAN-OUT STRUCTURE AND METHOD

(71) Applicant: Taiwan Semiconductor Manufacturing Company, Ltd., Hsin-Chu (TW)

(72) Inventors: Hao-Jan Pei, Hsin-Chu (TW); Hui-Min Huang, Taoyuan (TW); Hsiu-Jen Lin, Zhubei (TW); Ming-Da Cheng, Jhubei (TW); Chung-Shi Liu, Hsin-Chu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/529,880

(22) Filed: Oct. 31, 2014

(65) Prior Publication Data

US 2016/0126226 A1    May 5, 2016

(51) Int. Cl.
*H01L 23/02* (2006.01)
*H01L 25/10* (2006.01)
(Continued)

(52) U.S. Cl.
CPC ......... *H01L 25/105* (2013.01); *H01L 21/6835* (2013.01); *H01L 21/6836* (2013.01); *H01L 24/19* (2013.01); *H01L 24/20* (2013.01); *H01L 24/97* (2013.01); *H01L 25/50* (2013.01); H01L 24/32 (2013.01); H01L 24/48 (2013.01); H01L 24/73 (2013.01); H01L 24/83 (2013.01); H01L 24/92 (2013.01); H01L 2221/68331 (2013.01); H01L 2221/68359 (2013.01); H01L 2221/68372 (2013.01); H01L 2224/04105 (2013.01); H01L 2224/12105 (2013.01); H01L 2224/32145 (2013.01); H01L 2224/32225 (2013.01); H01L 2224/48091 (2013.01);
(Continued)

(58) Field of Classification Search
CPC ............ H01L 27/11582; H01L 2224/96; H01L 23/481; H01L 25/50; H01L 25/105; H01L 21/6836; H01L 21/6835; H01L 24/19; H01L 24/20; H01L 24/97; H01L 2221/68359; H01L 2221/68331; H01L 2221/68372; H01L 2924/181; H01L 2224/48227; H01L 2225/1041; H01L 2224/32145
USPC ........................................................ 257/686
See application file for complete search history.

(56) References Cited

U.S. PATENT DOCUMENTS 7,141,448 B2    11/2006    Ramalingam et al.
7,944,034 B2 *    5/2011    Gerber ............... H01L 21/561
                                                           257/680

(Continued)

*Primary Examiner* — Tod T Van Roy
*Assistant Examiner* — Vu A Vu
(74) *Attorney, Agent, or Firm* — Slater Matsil, LLP

(57) ABSTRACT

A semiconductor package comprises a top package and a bottom package with fan-out interconnect structures. A plurality of inter-package connectors electrically connect the top package and the bottom package, and are located near a perimeter of the semiconductor package. A first material is located in a space delimited by a lower surface of the top package, an upper surface of the bottom package, and the inner-most inter-package connectors of the semiconductor package, wherein the first material partially fills the space. A second material different from the first material encapsulates the inter-package connectors.

20 Claims, 21 Drawing Sheets

(51) Int. Cl.
*H01L 25/00* (2006.01)
*H01L 23/00* (2006.01)
*H01L 21/683* (2006.01)

(52) U.S. Cl.
CPC ............... *H01L 2224/48227* (2013.01); *H01L 2224/73265* (2013.01); *H01L 2224/73267* (2013.01); *H01L 2224/83005* (2013.01); *H01L 2224/92244* (2013.01); *H01L 2224/97* (2013.01); *H01L 2225/0651* (2013.01); *H01L 2225/06568* (2013.01); *H01L 2225/1035* (2013.01); *H01L 2225/1041* (2013.01); *H01L 2225/1058* (2013.01); *H01L 2225/1094* (2013.01); *H01L 2924/15311* (2013.01); *H01L 2924/181* (2013.01); *H01L 2924/3511* (2013.01)

(56) References Cited

U.S. PATENT DOCUMENTS

| | | | |
|---|---|---|---|
| 8,558,400 B2 | 10/2013 | Park et al. | |
| 2009/0115045 A1* | 5/2009 | Hsu et al. | 257/686 |
| 2011/0133325 A1* | 6/2011 | Moon et al. | 257/686 |
| 2012/0280404 A1* | 11/2012 | Kwon et al. | 257/777 |
| 2013/0120952 A1* | 5/2013 | Kim | H01L 23/49822 361/783 |
| 2013/0187266 A1* | 7/2013 | Chen | H01L 24/81 257/737 |
| 2013/0200528 A1* | 8/2013 | Lin et al. | 257/774 |

* cited by examiner

INTEGRATED FAN-OUT STRUCTURE AND METHOD

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

An example of these packaging technologies is the Package-on-Package (POP) technology. In a PoP package, a top semiconductor packages is stacked on top of a bottom semiconductor package to allow high level of integration and component density. This high level of integration from PoP technology enables production of semiconductor devices with enhanced functionalities and small footprints on the printed circuit board (PCB). A semiconductor package with a small footprint on PCB is advantageous for small form factor devices such as mobile phones, tablets and digital music players. Another advantage of a PoP package is that it minimizes the length of the conductive paths connecting the interoperating parts within the package. This improves the electrical performance of the semiconductor device, since shorter routing of interconnections between circuits yields faster signal propagation and reduced noise and cross-talk.

Many challenges exist for the manufacturing of PoP packages. For example, due to the mismatch of the coefficient of thermal expansion (CTE) for the different materials used in the package, warpage can occur when the semiconductor package is subjected to repeated heating and cooling cycles during test and normal usage. Serious warpage can cause defects such as cracks and delamination to occur in the semiconductor package. Warpage can also cause unreliable or broken electrical connection between the package and the PCB.

Efforts have been made to address different difficulties for the PoP technology. However, there is still a need in the art for PoP type semiconductor packages which have improved mechanical and/or electrical characteristics.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. Corresponding numerals and symbols in the different figures generally refer to corresponding parts unless otherwise indicated.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1A:
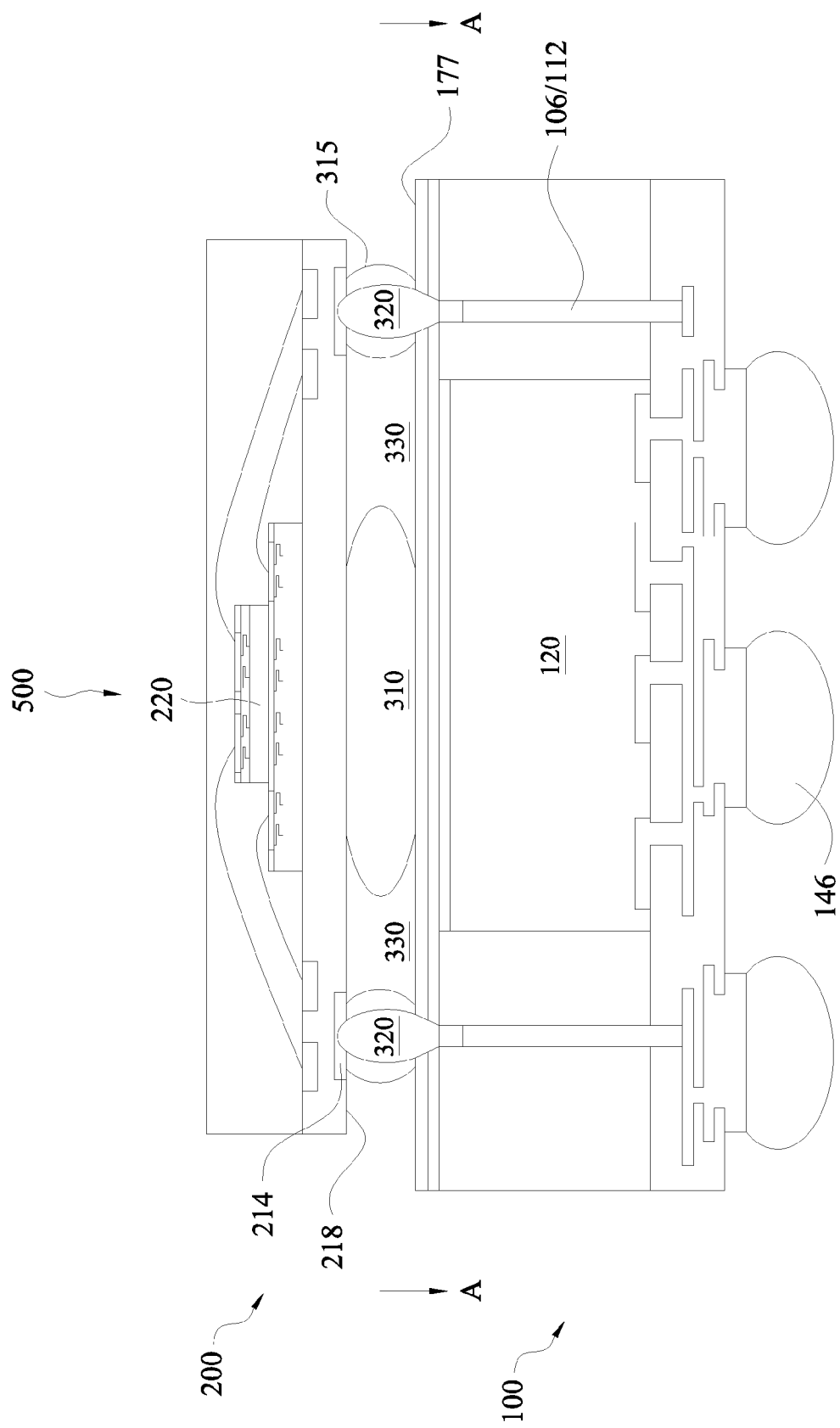
FIG. 1a illustrates a cross sectional view of a semiconductor PoP package in accordance with various embodiments of the present disclosure.

FIG. 1a illustrates a cross sectional view of a PoP package 500 in accordance with some embodiments of the present disclosure. The PoP package 500 contains a top semiconductor package 200 stacked on top of a bottom semiconductor package 100. Inter-package connectors 320 are formed between the top package and the bottom package to mechanically and electrically couple contact pads 214 at the lower surface 218 of the top package 200 to a top surface of through-vias 106/112 near an upper surface 177 of the lower package 100. The inter-package connectors 320 are located near a perimeter of the PoP package 500, in accordance with some embodiments. A first material 310 is formed in the center of a space 330 delimited by a lower surface 218 of the top package 200, an upper surface 177 of the bottom package 100, and the inner-most inter-package connectors 320 of PoP package 500. The first material 310 partially fills the space 330, in some embodiments. At least center portions of the first material 310 contact an upper surface 177 of the bottom package and a lower surface 218 of the top package, in some embodiments. A second material 315 surrounds and encapsulates the inter-package connectors 320 and contacts a lower surface of the top package 218 and the upper surface 177 of the bottom package, in some embodiments.

Figure 1B:
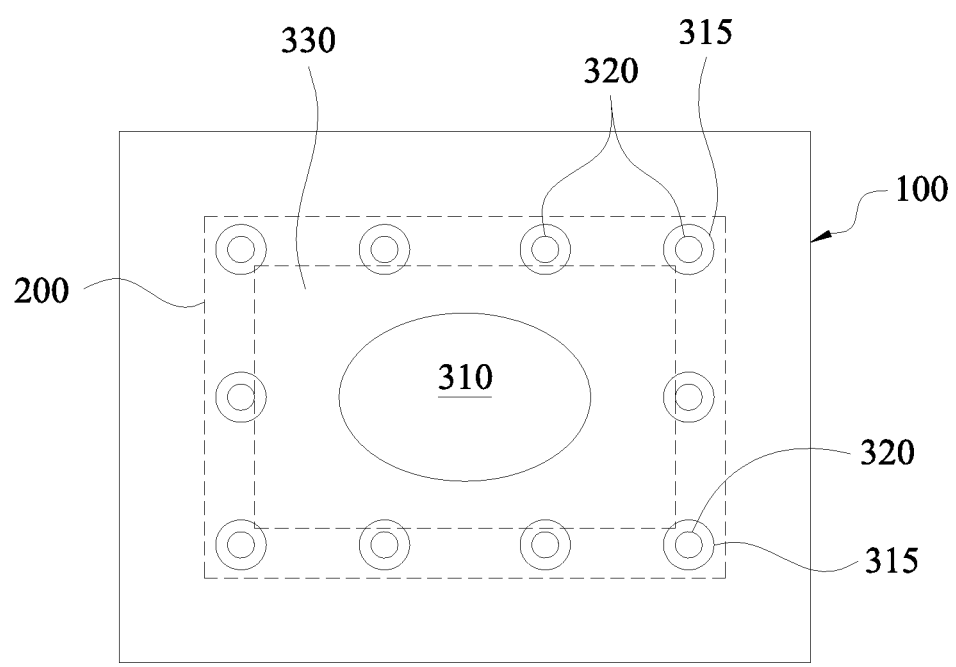
FIG. 1b-1d illustrate cross sectional views of a semiconductor PoP package with one or more rows and columns of inter-package connectors with various embodiments of the present disclosure.
Figure 1C:
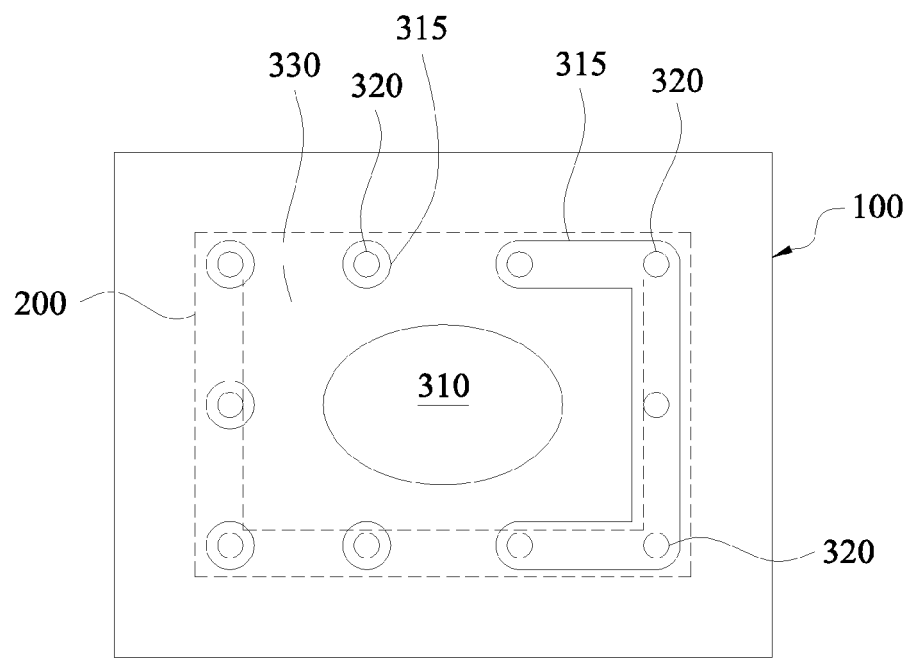

FIG. 1b shows a cross sectional view of a PoP package 500 viewed from the top and cut along a plane as indicated by line A-A in FIG. 1a between top package 200 (shown in phantom) and bottom package 100, in some embodiments. As shown in FIG. 1b, there may be one row or one column of inter-package connectors 320 along each side of the perimeter of top package 200, in some embodiments. First material 310 is formed in the center of space 330 (shown in phantom), in accordance with some embodiments. Each inter-package connector 320 is encapsulated by second material 315 individually, in some embodiments. In some other embodiments, some of the inter-package connector 320 are encapsulated by second material 315 individually, while other inter-package connectors 320 are encapsulated by second material 315 together, as shown in FIG. 1*c*.

Figure 1D:
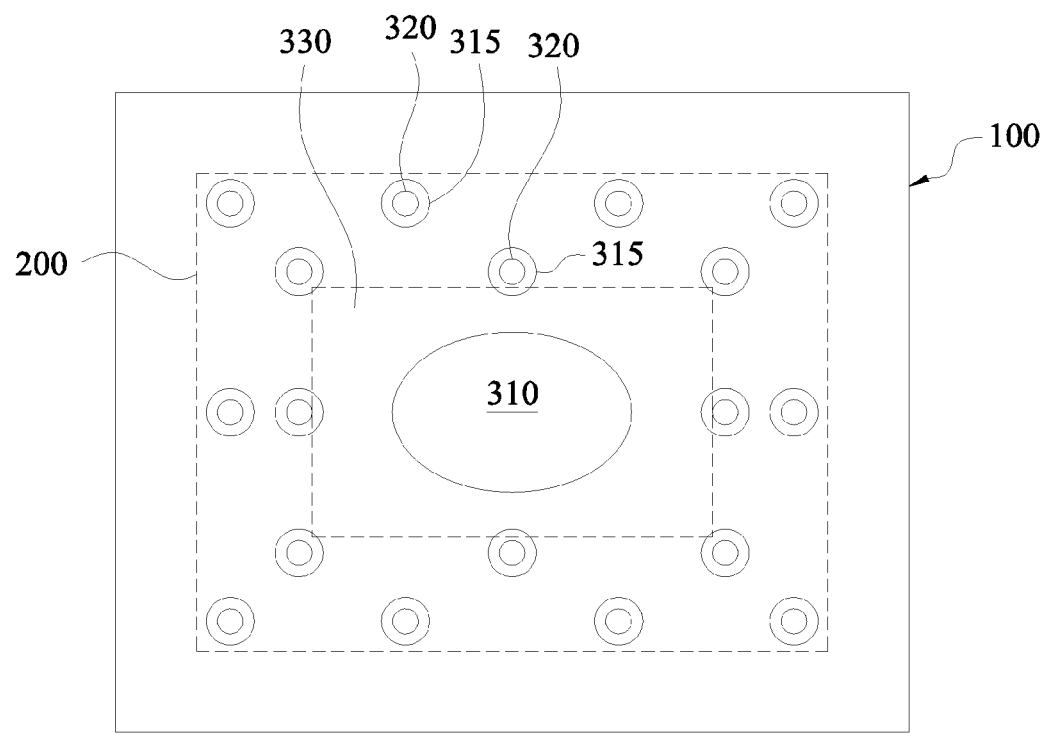

FIG. 1*d* shows a cross sectional view similar to FIG. 1*b*, with a plurality of rows or columns of inter-package connectors 320 along each side of the perimeter of top package 200. First material 310 is formed in the center of space 330 (shown in phantom), in accordance with some embodiments. Each inter-package connector 320 is encapsulated by second material 315 individually, in some embodiments. Some of the inter-package connectors 320 may be encapsulated by second material 315 together (not shown), in some embodiments.

Figure 2:
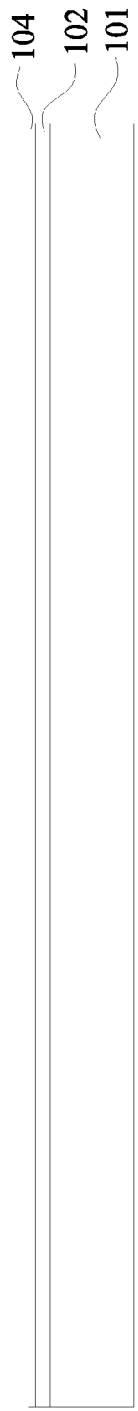
FIG. 2-19 illustrate cross sectional views of a PoP package at various manufacturing stages, in accordance with various embodiments of the present disclosure.

FIGS. 2 through 19 are cross-sectional views illustrating steps of fabricating a semiconductor PoP package shown in FIG. 1*a* in accordance with some embodiments. Referring first to FIG. 2, to fabricate the semiconductor PoP package in FIG. 1*a*, a carrier 101 is provided. The carrier 101 may comprise glass, silicon oxide, aluminum oxide, or a semiconductor wafer, as examples. The carrier 101 may also comprise other materials. The carrier may be circular, square, or rectangular in a top view, as examples. Alternatively, the carrier 101 may comprise other shapes.

The carrier 101 has a film 102 formed thereon in some embodiments. The film 102 comprises a light to heat conversion (LTHC) material or other materials, for example. The LTHC film 102 comprises a thickness of about 0.5 µm to about 3 µm, for example. Alternatively, the film 102 may comprise other dimensions. In some embodiments, the film 102 is not included.

An insulating material 104 is disposed over the film 102, as shown in FIG. 2. The insulating material 104 is formed over the carrier 101 in embodiments wherein the film 102 is not included. The insulating material 104 comprises a passivation layer for the package. The insulating material 104 comprises a glue/polymer base buffer layer in some embodiments, for example. The insulating material 104 comprises a solder resist (SR), polyimide (PI), polybenzoxazole (PBO), or multiple layers or combinations thereof in some embodiments, as examples. The insulating material 104 comprises a thickness of about 1 µm to about 20 µm, for example. Alternatively, the insulating material 104 may comprise other materials and dimensions. The insulating material 104 is formed using spin coating, lamination, or other methods, for example.

Figure 3:
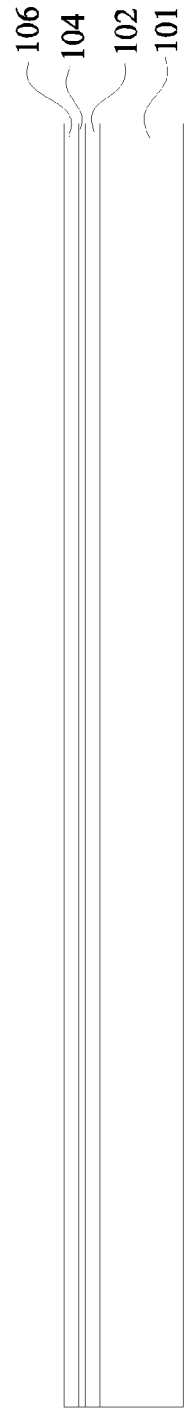

Next, a seed layer 106 is formed over the insulating material 104, as shown in FIG. 3. The seed layer 106 comprises a seed material for a subsequent plating process for through-vias, to be described further herein. The seed layer 106 comprises a metal, such as copper, a titanium and copper alloy, other metals, alloys, combinations or multiple layers thereof, as examples. The seed layer 106 comprises a thickness of about 500 Angstroms to about 5,000 Angstroms, for example. Alternatively, the seed layer 106 may comprise other materials and dimensions. The seed layer 106 is formed by physical vapor deposition (PVD) or other methods.

Figure 4:
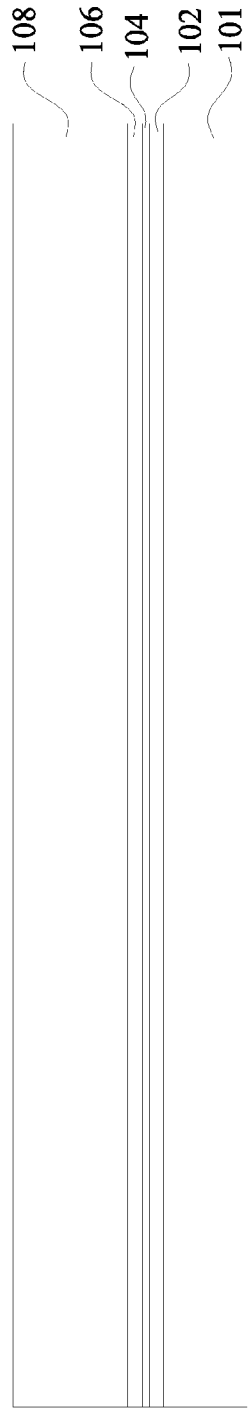
Figure 5:
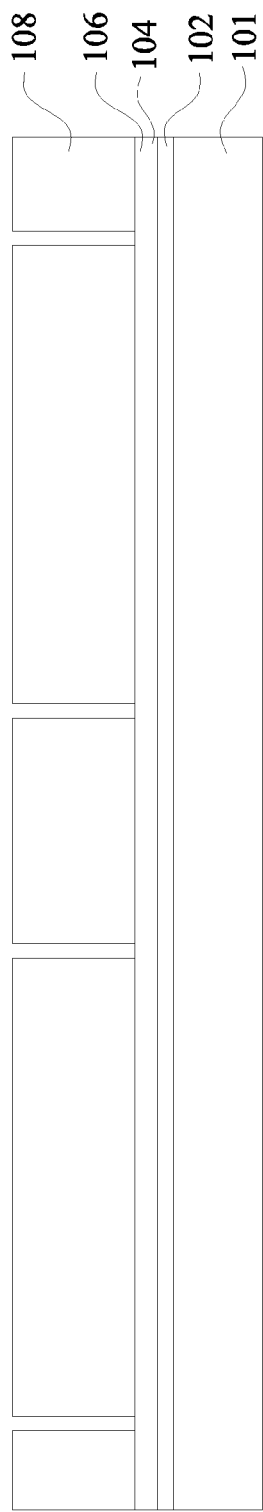

A sacrificial material 108 is then formed over the seed layer 106, as shown in FIG. 4. The sacrificial material 108 comprises a photoresist, an organic material, an insulating material, or other materials, in some embodiments, as examples. The sacrificial material 108 is patterned with a desired pattern for a plurality of through-vias using a lithography process or a direct patterning process, as shown in FIG. 5. In a lithography process, the sacrificial material 108 comprising a photoresist or other material is exposed to light or energy reflected from or transmitted through a lithography mask (not shown) that has the desired pattern thereon. The sacrificial material 108 is then developed, and portions of the sacrificial material 108 are then ashed or etched away. A direct patterning process may comprise forming the pattern in the sacrificial material 108 using a laser, for example. Alternatively, the sacrificial material 108 may be patterned using other methods.

Figure 6:
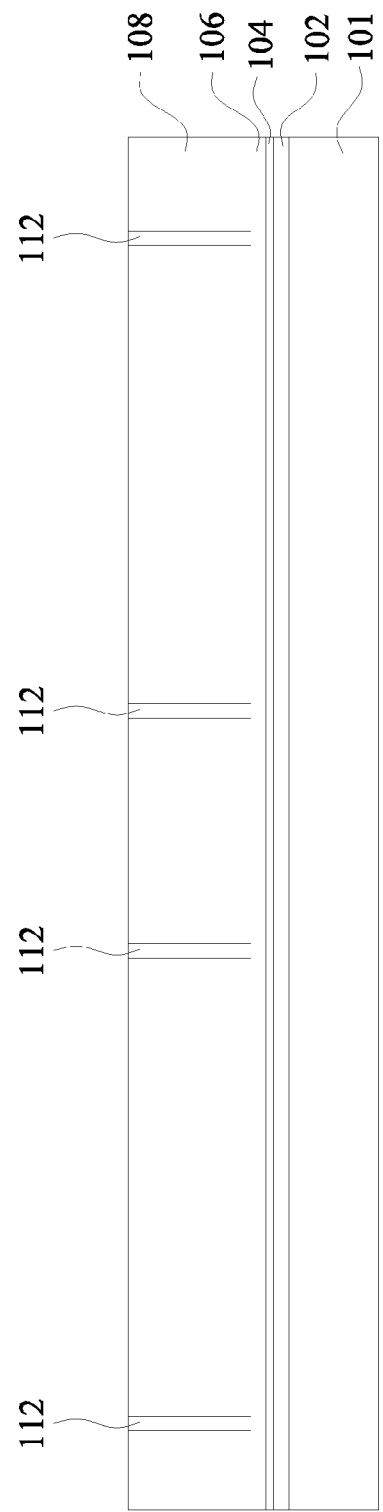

A plating process is used to form a conductive material 112 in the patterns of the sacrificial material 108 over the seed layer 106, as shown in FIG. 6. The plating process may comprise an electro-chemical plating (ECP) or other types of plating processes, for example. The seed layer 106 functions as a seed for the plating process for the conductive material 112. The conductive material 112 is plated over the seed layer 106 through the patterned sacrificial material 108.

Figure 7:
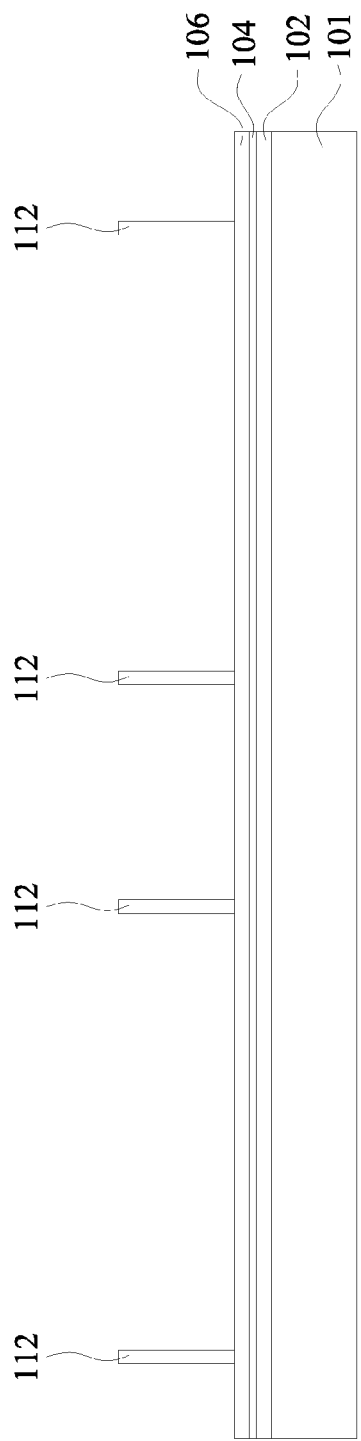

The sacrificial material 108 is then stripped or removed, as shown in FIG. 7. After the sacrificial material 108 is removed, portions of the seed layer 106 are left remaining over the insulating material 104 between the conductive material 112 that has been plated onto the seed layer 106.

Figure 8:
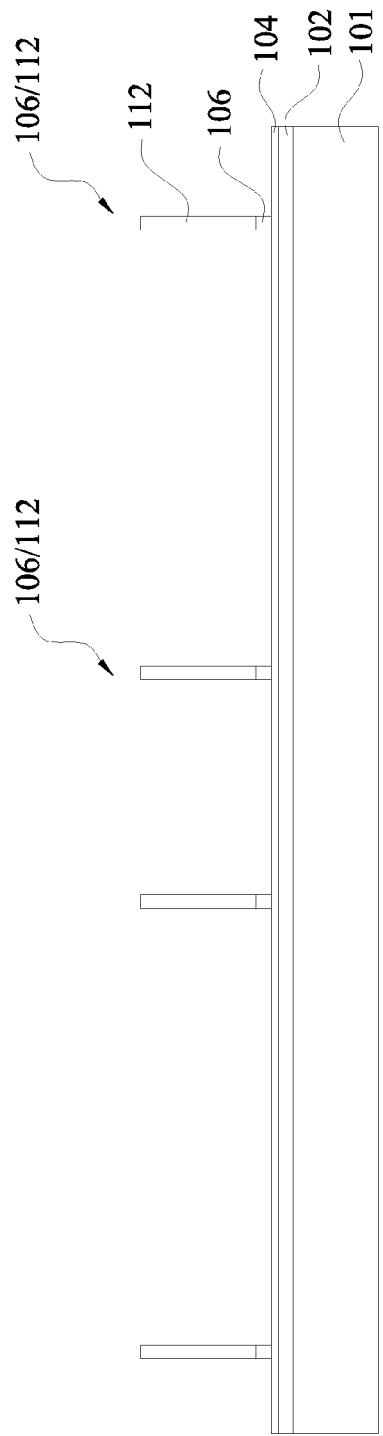

The exposed portions of the seed layer 106 are then removed, as shown in FIG. 8. An etch process or other process is used to remove the exposed portions of the seed layer 106 between the regions of conductive material 112, for example. The seed layer 106 and the conductive material 112 comprise through-vias 106/112 of a package for a semiconductor device. The through-vias 106/112 each comprise a lower portion comprising the material of the seed layer 106 and an upper portion comprising the plated-on conductive material 112.

In other embodiments, the through-vias 106/112 may be formed using subtractive techniques, damascene techniques, or other methods. For example, in a subtractive technique, a conductive material such as Cu, a Cu alloy, other metals, or combinations or multiple layers thereof may be formed over the entire surface of the insulating material 104, and the conductive material is patterned to form the through-vias 106/112. The through-vias 106/112 may comprise a single material layer in these embodiments, for example, not shown. The conductive material may be patterned using photolithography, by forming a layer of photoresist over the conductive material, exposing the layer of photoresist to light or energy reflected from or transmitted through a lithography mask having a desired pattern thereon, and developing the layer of photoresist. Exposed (or unexposed, depending on whether the layer of photoresist is positive or negative) portions of the layer of photoresist are then ashed and removed. The patterned layer of photoresist is then used as an etch mask during an etch process for the conductive material. The layer of photoresist is removed, leaving the conductive material patterned with the desired pattern of the through-vias 106/112.

A first side of the through-vias 106/112 is coupled to the insulating material 104 in some embodiments, for example.

Figure 9:
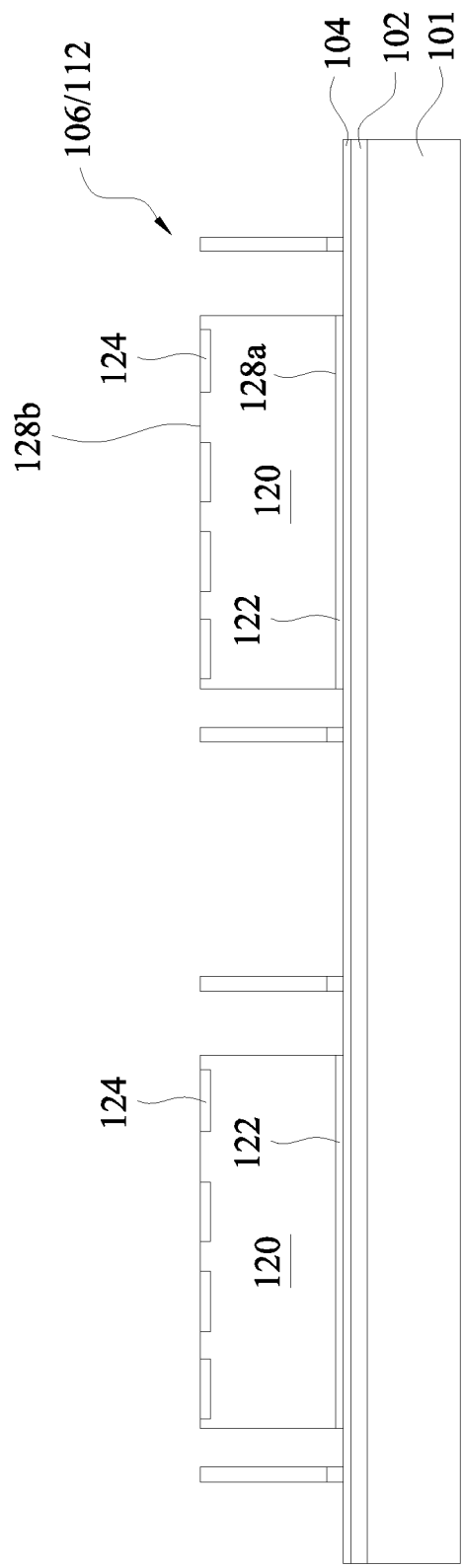

Referring next to FIG. 9, after the formation of the through-vias 106/112, a plurality of semiconductor devices 120 are provided and are bonded to the insulating material 104. Each semiconductor device 120 may have one chip inside, in some embodiments. The semiconductor device 120 may include a plurality of chips stacked together by a suitable method, in accordance with some embodiments. The plurality of semiconductor chips in the semiconductor device 120 may be of the same type, such as digital signal processors (DSP) or memory chips. Alternatively, these semiconductor chips may be of different types, with some being DSP chips, some being logic chips, and yet some others being memory chips.

The semiconductor devices 120 each includes a first side 128a and a second side 128b, the second side 128b being opposite the first side 128a. The first sides 128a of the integrated circuit dies 120 are coupled to the insulating material 104.

The semiconductor devices 120 each include a plurality of contact pads 124 formed across the second side 128b thereof. The contact pads 124 are electrically coupled to the chip(s) inside the semiconductor device 120. The contact pads 124 comprise a conductive material such as copper, aluminum, other metals, or alloys or multiple layers thereof, as examples. Alternatively, the contact pads 124 may comprise other materials. The second side 128b of the semiconductor device is also referred to as the front side or active side of the semiconductor device. The first side 128a does not have contact pads formed thereon and is also referred to as the back side or non-active side of the semiconductor device. Alternatively, the semiconductor devices 120 may include through-vias, thereby providing electrical connection on the first side 128a and the second side 128b.

A plurality of the semiconductor devices 120 are coupled to the carrier 101 over the insulating material 104. Only two semiconductor devices 120 are shown in FIGS. 9 through 19; however, dozens, hundreds, or more semiconductor devices 120 may be coupled to carrier 101 and packaged simultaneously. The first sides 128a of semiconductor devices 120 are coupled to carrier 101, over the insulating material 104. The integrated circuit dies 120 may be coupled to the insulating material 104 using an adhesive 122, such as a die attach film (DAF), for example. The semiconductor devices 120 may be coupled to the insulating material 104 manually or using an automated machine such as a pick-and-place machine.

Figure 10:
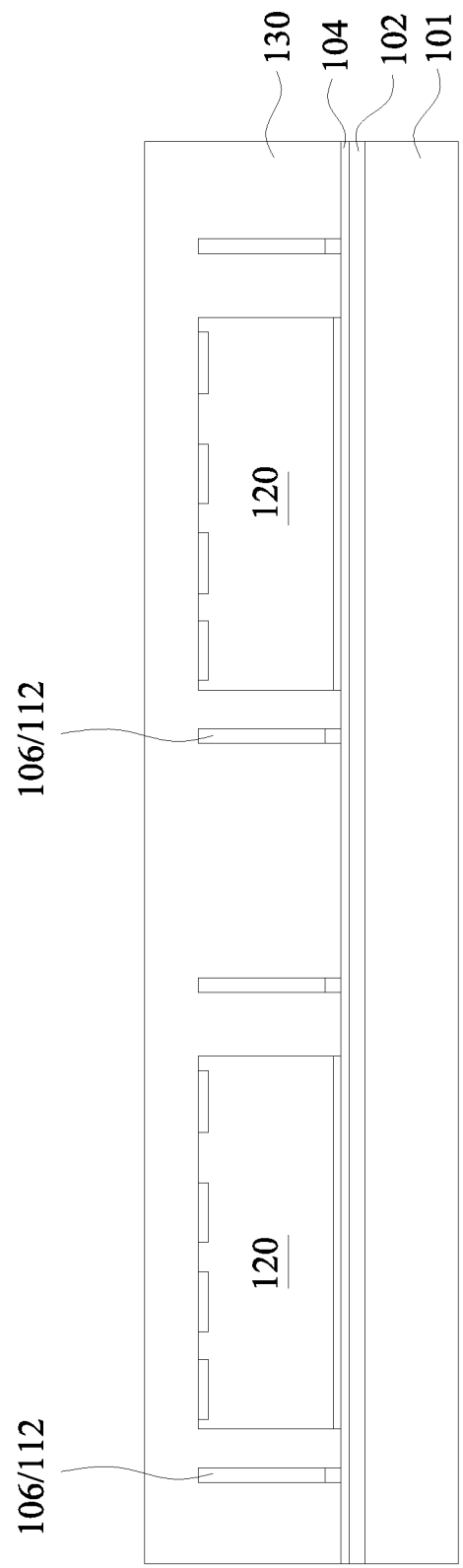

A molding material 130 is then formed over the insulating material 104 to encapsulate semiconductor devices 120 and through-vias 106/112, as shown in FIG. 10. The molding material 130 is applied using a wafer level molding process in some embodiments, for example. The molding material 130 may be molded using, for example, compressive molding, transfer molding, or other methods. The molding material 130 may comprise an epoxy, an organic polymer, a polymer with or without a silica-based or glass filler added, or other materials, as examples. In some embodiments, the molding material 130 comprises a liquid molding compound (LMC) that is a gel type liquid when applied. The molding material 130 may also comprise a liquid or solid when applied. Alternatively, the molding material 130 may comprise other insulating and/or encapsulating materials.

Next, the molding material 130 is cured using a curing process in some embodiments. The curing process may comprise heating the molding material 130 to a predetermined temperature for a predetermined period of time, using an anneal process or other heating process. The curing process may also comprise an ultra-violet (UV) light exposure process, an infrared (IR) energy exposure process, combinations thereof, or a combination thereof with a heating process. Alternatively, the molding material 130 may be cured using other methods. In some embodiments, a curing process is not included.

Figure 11:
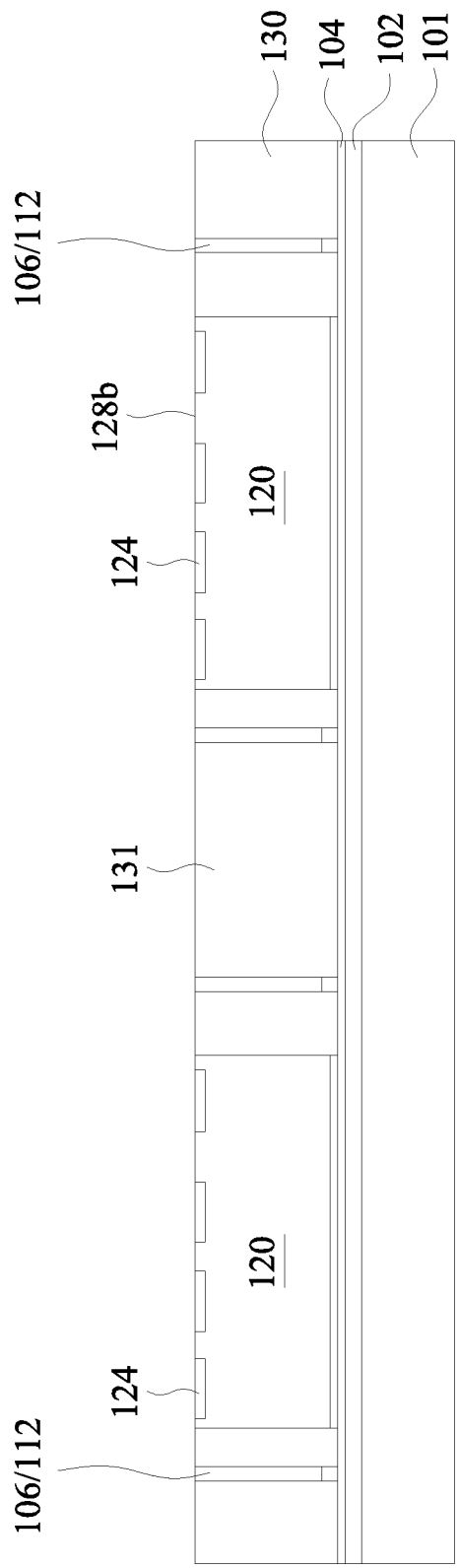

A top portion of the molding material 130 is then removed, as shown in FIG. 11. The top portion of the molding material 130 is removed using a grinding process in some embodiments, for example. In some embodiments, a chemical-mechanical polishing (CMP) process is used to remove the top portion of the molding material 130, for example. A combination of a grinding process and a CMP process may also be used. The CMP process or grinding process may be adapted to stop when the second sides 128b of semiconductor devices 120 and/or the top surfaces of the through-vias 106/112 are reached in some embodiments, for example. The CMP process and/or grinding process comprise a front-side grinding process in some embodiments.

Figure 12:
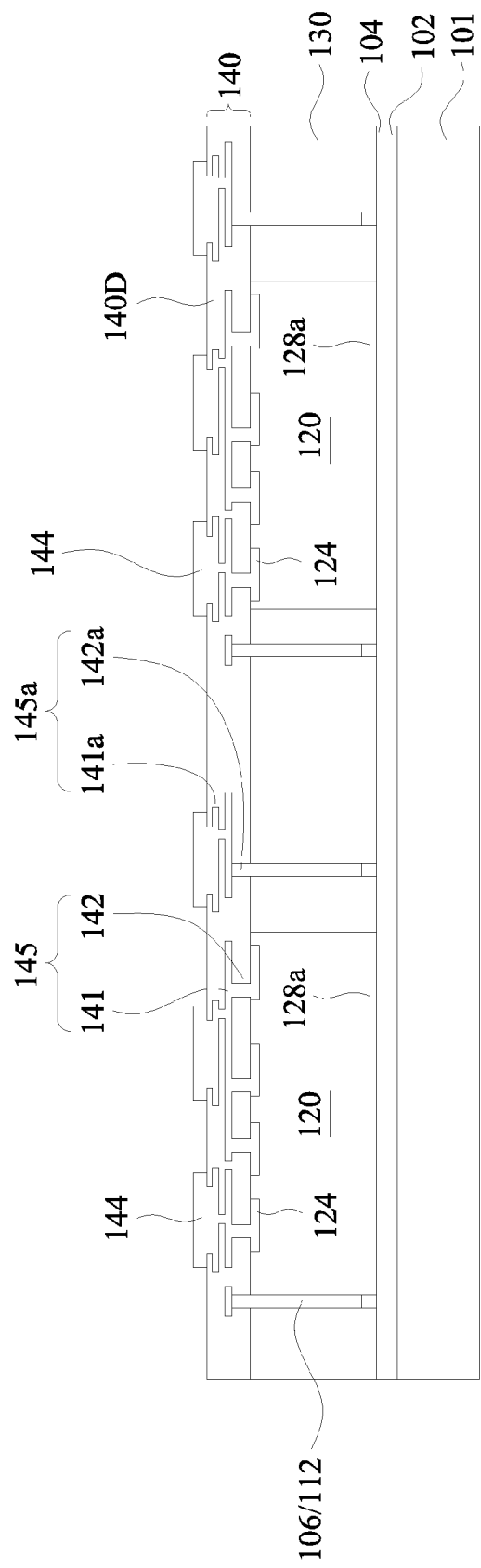

In some embodiments, a top surface 131 of the molding material 130 after the grinding and/or CMP process, is substantially coplanar with the second sides 128b of the semiconductor devices 120 and the top surfaces of the through-vias 106/112. The top surface 131 of molding material being substantially coplanar with the second sides 128b and the top surfaces of through-vias 106/112 advantageously facilitates in the formation of a subsequently formed redistribution layer (RDL) 140, which is illustrated in FIG. 12.

The redistribution layer (RDL) 140 is formed over the plurality of semiconductor devices 120, the molding material 130, and the top surfaces of the through-vias 106/112, in some embodiments. The RDL 140 includes one or more dielectric layers 140D, and a plurality of conductive metal lines 141/141a and/or a plurality of conductive metal vias 142/142a formed inside the one or more dielectric layers 140D. The plurality of conductive metal lines 141/141a and plurality of metal vias 142/142a form interconnector structures 145/145a. Interconnect structures 145a enable fan-out for semiconductor devices 120, since they are located outside a boundary of semiconductor devices 120, hence they are also called fan-out interconnect structures 145a hereafter. Fan-out interconnect structures 145a are connected to through-vias 106/112 to provide easy access to electrical connection proximate back sides (e.g., side 128a) of semiconductor devices 120, so that top packages 200 can be electrically connected to bottom packages 100 in subsequent processing, in some embodiments.

The dielectric layers 140D may be formed, for example, of a low dielectric constant (low-K) dielectric material, such as phosphosilicate glass (PSG), borophosphosilicate glass (BPSG), fluorinated silicate glass (FSG), SiOxCy, spin-on-glass, spin-on-polymers, silicon carbon material, compounds thereof, composites thereof, combinations thereof, or the like, by any suitable method, such as spinning, CVD, and/or plasma-enhanced CVD (PECVD). The conductive lines 141/141a and conductive vias 142/142a may comprise copper, copper alloys, other metals or alloys, or combinations or multiple layers thereof, as examples. The conductive lines 141/141a and conductive vias 142/142a may be formed using subtractive and/or damascene techniques, as examples. The conductive lines 141/141a and conductive vias 142/142a may be formed using one or more sputtering processes, photolithography processes, plating processes, and photoresist strip processes, as examples. Other methods can also be used to form the interconnect structures 145/145a. The interconnect structures 145/145a include contact pads 144 formed proximate a top surface of the RDL 140. The contact pads 144 may comprise under-ball metallization (UBM) structures in some embodiments that are arranged in a ball grid array (BGA) or other patterns or arrangements.

Figure 13:
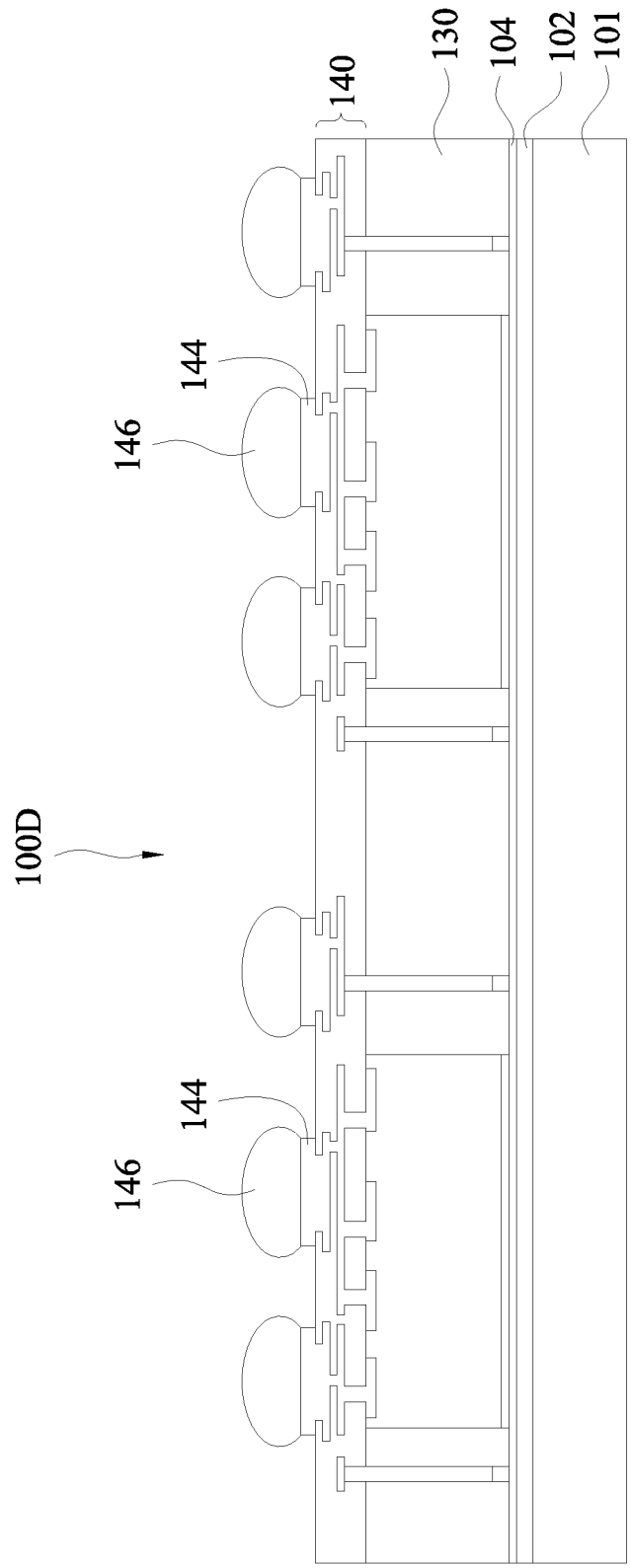

In some embodiments, a plurality of connectors 146 are then coupled to the contact pads 144 of the redistribution layer, as shown in FIG. 13. The carrier 101 and the structures formed thereon described herein are referred to as structure 100D hereinafter. The connectors 146 may comprise a eutectic material such as solder, for example. The eutectic material may comprise solder balls or solder paste in some embodiments that is reflowed by heating the eutectic material to a melting temperature of the eutectic material. The connectors 146 are attached using a ball mount process or other process. The eutectic material is then allowed to cool and re-solidify, forming the connectors 146. The connectors 146 may include other types of electrical connectors, such as microbumps, controlled collapse chip connection (C4) bumps, or pillars, and may include conductive materials such as Cu, Sn, Ag, Pb, or the like. In some embodiments, the connectors 146 are not included on the package. A test of the connectors 146 is then conducted in some embodiments, to ensure electrical and structural integrity of the connections made.

In some embodiments, an insulating material is formed between the connectors 146 over the RDL 140, not shown. The insulating material comprises a LMC in some embodiments. The insulating material may alternatively comprise other materials. In other embodiments, the insulating material is not included.

Figure 14:
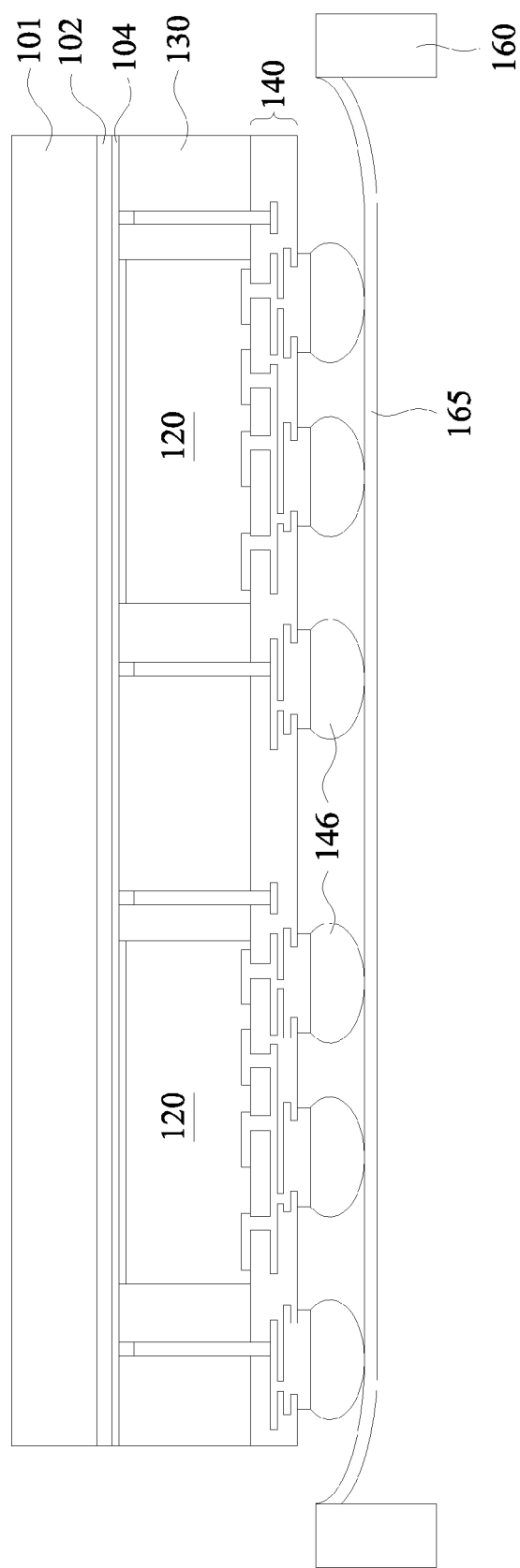
Figure 15:
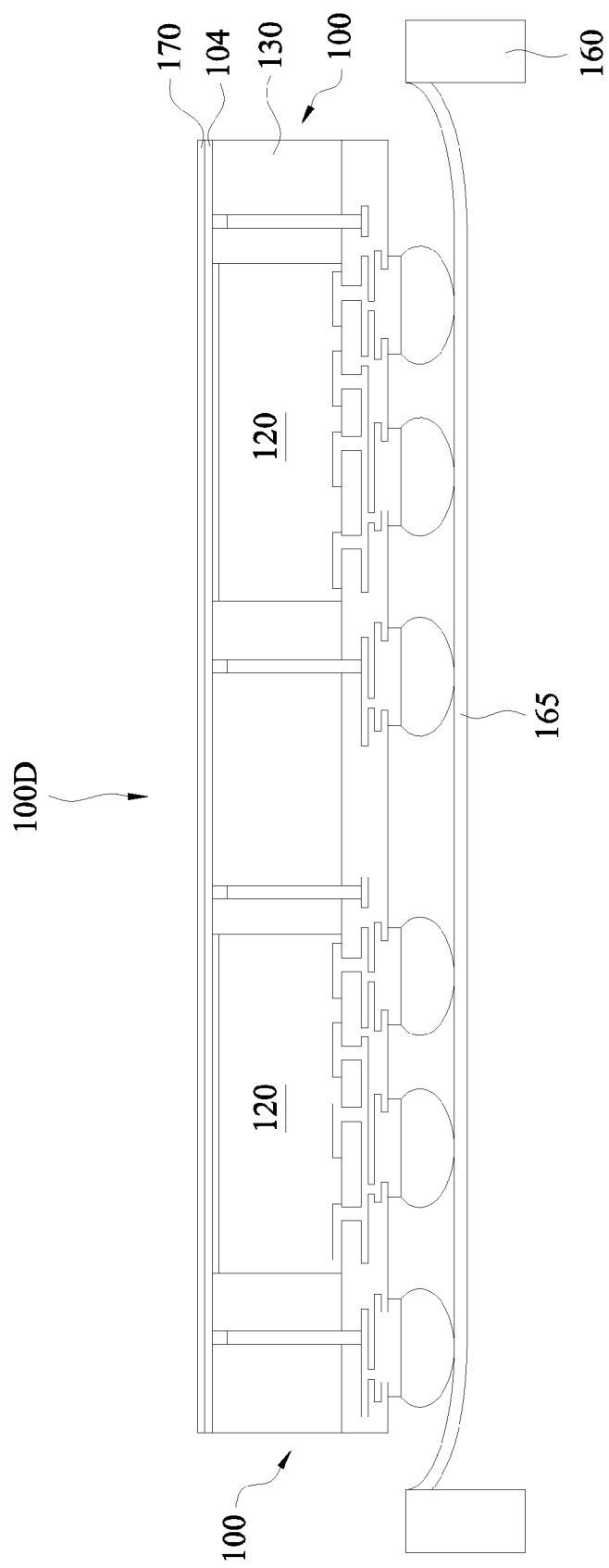

Structures 100D formed in FIG. 13 is then inverted and coupled to a dicing tape 165, as shown in FIG. 14. The dicing tape 165 is coupled to a support 160. The support 160 might be a metal frame, in some embodiments. Next, carrier 101 and film 102 are removed, using a de-bonding process, and a protective film 170 is formed over the insulating material 104 after the carrier de-bonding process, as shown in FIG. 15, in some embodiments. The protective film 170 comprises a back side lamination film in some embodiments, for example. The protective film 170 comprises about 1 μm to about 100 μm of a lamination coating (LC) tape or DAF, as examples. The protective film 170 is formed using a laminating process in some embodiments. The protective film 170 may also comprise other materials, dimensions, and formation methods. In some embodiments, the lamination film 170 is not included.

Structure 100D shown in FIG. 15 now comprises a plurality of bottom packages 100 that will be used to form a plurality of PoP packages 500 in subsequent processing.

Figure 16:
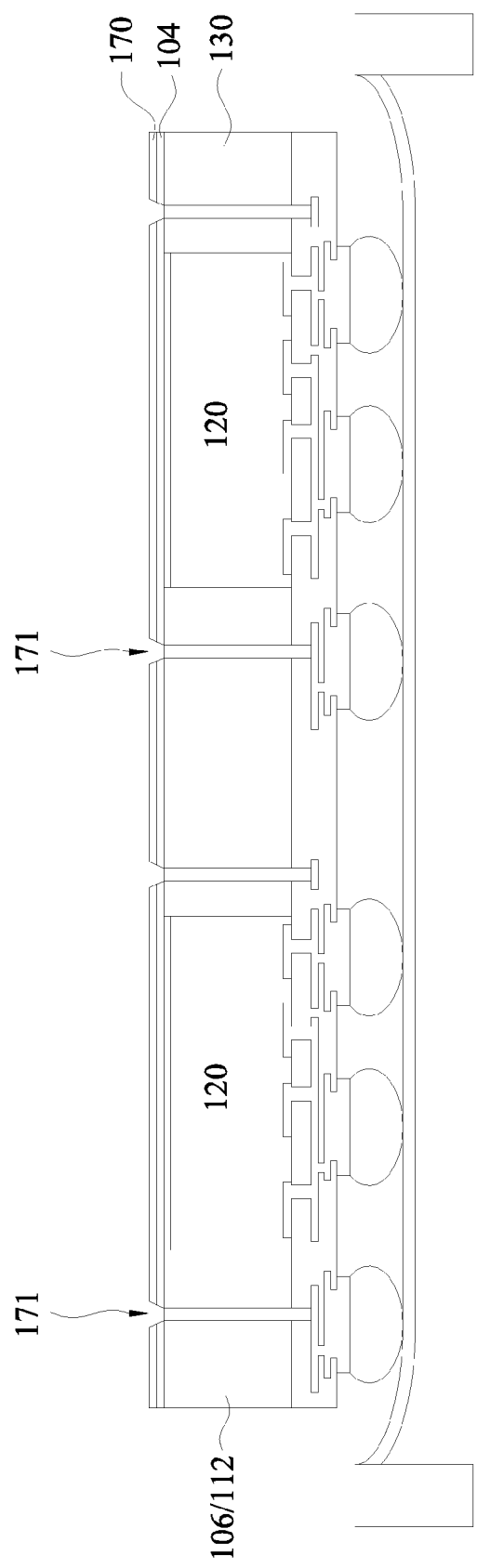

The insulating material 104 is then patterned to expose a top surface of through-vias 106/112, as shown in FIG. 16. In embodiments wherein the protective film 170 is included, the protective film 170 is also patterned, as shown in FIG. 16. The openings 171 in the insulating material 104 and protective film 170 may be formed using a lithography process or a direct patterning method, as examples. In accordance with an embodiment of the present disclosure, laser drilling may be used to form openings 171 through protective film 170 and the insulating material 104 to expose the top surfaces of through-vias 106/112.

Figure 17:
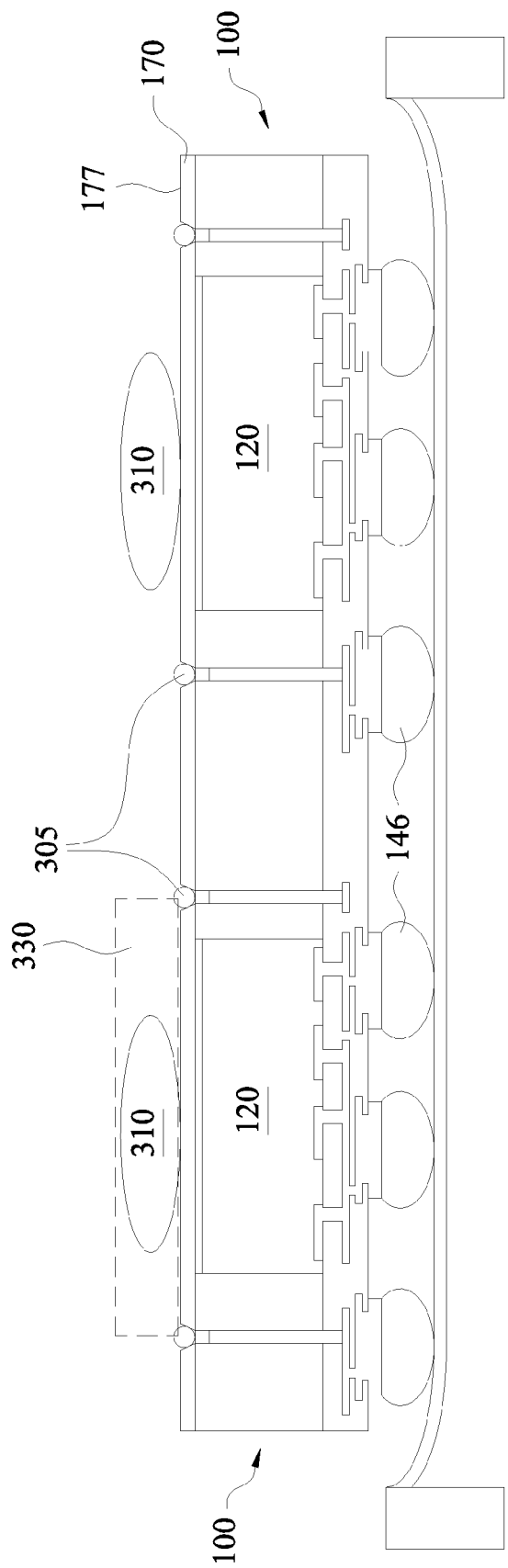

FIG. 17 illustrates a cross sectional view of the structure shown in FIG. 16 after a first material 310, hereafter Material-1, is formed on a top surface 177 of bottom packages 100 and solder paste 305 is formed in openings 171. Solder paste 305 may be formed in openings 171 by a solder printing process using a solder printing machine, in some embodiments.

FIG. 17 shows a space 330 in phantom. The center of space 330 is substantially free of openings 171 and solder paste 305. Material-1 may be formed in the center of space 330 by a printing process similar to a solder paste printing process, in some embodiments. Material-1 may be dispensed in the center of space 330 by a needle or jetting dispenser, similar to an underfill dispensing process, in some other embodiments. Material-1 partially fills space 330. In accordance with some embodiments, Material-1 fills up substantially 30%-65% the volume of space 330. The process for determining the exact percentage of the volume for Material-1 in space 330, as well as the composition (i.e., solute, solvent, and mixing ratio for solute and solvent) of Material-1, is described in details below.

Material-1 may be formed by mixing a solute with a solvent, wherein the solute may be $SiO_2$, $Al_2O_3$, $TiO_2$, etc., and the solvent might be epoxy, acrylic, polypropylene, polyimide, etc. The typical CTE for epoxy is approximately 70 ppm/° C., and the CTE for $SiO_2$ is approximately 2 ppm/° C. As an example, by changing the mixing ratio of $SiO_2$ (an example of solute) with epoxy (an example of solvent), the CTE of the mixture (an example of Material-1) can be varied between a range substantially from 2 ppm/° C. to 70 ppm/° C. In the above example, decreasing the amount of solute in the mixture causes the CTE of the mixture to increase.

Due to the CTE mismatch between the different layers of materials in a PoP package, the PoP package may experiences significant warpage. For example, the package may originally have little warpage at high temperature. However, at room temperature, a commonly encountered warpage situation is such that the edge portion of the bottom package bends downward and away from the top package. This warpage situation may occur because the upper layers of the bottom package have CTE smaller than that of the lower layers. As the package cools down, the lower layers shrink more than the upper layers, effectively exerting force to pull the edges of the bottom package downward. At a result of the warpage, inter-package connectors 320 located near the edge of the PoP package may experience significant mechanical stress, which may lead to broken solder joints. In addition, external connectors 146 on the bottom package may lie on a significantly curved surface, making it difficult to attach the PoP package to a flat PCB board.

The CTE of Material-1 may be adjusted to compensate for the warpage due to CTE mismatch in the package. For the warpage situation described above, a large CTE of Material-1 (larger than the CTE of the upper layers of the bottom package) may be desirable. This is because Materia-1 shrinks more than the upper layers of the bottom package when it cools down, effectively exerting force to pull the edges of the bottom package up—thus compensating the downward warpage experienced at the edge of the package, as examples.

One skilled in the art will appreciate from the above description that there are at least two parameters of Material-1 that can be tuned to compensate for the warpage of the package. First, the CTE coefficient of Material-1 can be adjusted by varying the mixing ratio of solute with solvent, as well as by choosing different solvent and solute. Second, for a given CTE, the amount of Material-1 in space 330 can be adjusted to provide different amount of compensating force. A larger amount of Material-1 may provide more compensating force, in some embodiments. However, Material-1 should not fill up space 330 and contact solder paste 305, to prevent cold joints from forming at inter-package connectors 320 during a subsequent reflow process. Unnecessarily large amount of Material-1 in space 330 may not be desirable due to material cost and processing time. The best range for the volume of Material-1 in space 330, as well as the mixing ratio for solvent and solute in Material-1, may be found by an experimental moiré pattern measurement process or computer simulations, which will be described in the following paragraphs, in some embodiments.

In an experimental moiré measurement process, both the CTE of Material-1 and the volume of Material-1 in space 330 may be changed for each experiment, and the corresponding warpage of the package may be determined by measuring and analyzing the moiré pattern using a defect inspector. The desired parameters for the composition (solute, solvent, and mixing ratio for solute and solvent) and volume of Material-1 for each particular PoP structure may be found through repeated experiments. The moiré pattern may be generated using known methods in the art. For example, a reference pattern etched on a low expansion quartz glass may be projected onto the warped surface of the semiconductor package. When observed from above the quartz glass, the geometric inference between the reference pattern and the projected pattern on the warped surface of the semiconductor package produces a moiré pattern. A defect inspector, such as the ICOS optical defect inspector from KLA-Tencor Corporation may be used to measure the amount of warpage.

In another embodiment, computer simulations may be used to determine the composition and volume of Material-1. The size, structure, and materials of the PoP package can be modeled and analyzed in simulations to determine the preferred parameters for Material-1.

In accordance with some embodiments, Material-1 may be formed by mixing a solute with a solvent, wherein the solute may be SiO2, Al2O3, TiO2, etc., and the solvent might be epoxy, acrylic, polypropylene, polyimide, etc. The amount of the solute in Material-1 is substantially between 0%~50% by weight, in some embodiments. In accordance with some embodiments, Material-1 comprising 20%-40% of solute and 80%-60% of solvent may work effectively. Material-1 fills up substantially 30%-65% the volume of space 330, in some embodiments. In some other embodiments, Material-1 may contain ceramic based materials.

Figure 18:
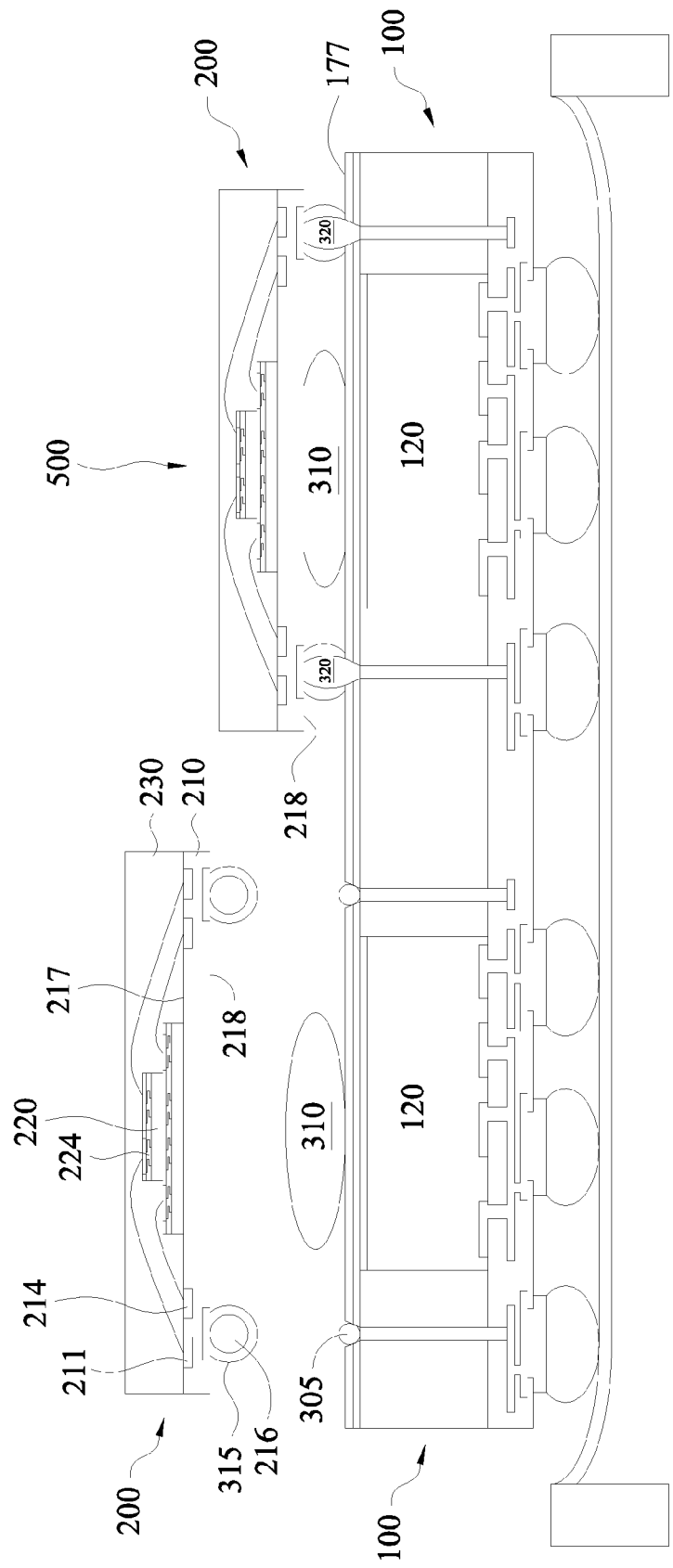

FIG. 18 shows, in sectional view, top packages 200 being stacked on top of bottom packages 100. As shown in FIG. 18, each top package 200 has a semiconductor device 220 mounted on an upper surface 217 of a substrate 210. The semiconductor device 220 may include one chip, in some embodiments. The semiconductor device 220 may include a plurality of semiconductor chips stacked together, in some embodiments. The semiconductor chips may be of the same type, such as digital signal processors (DSP) or memory chips. Alternatively, these semiconductor chips may have different functionalities, with some being DSP chips, some being logic chips, and yet some others being memory chips, in some embodiments. An upper molding layer 230 may be formed on an upper surface 217 of substrate 210 to encapsulate semiconductor device 220. Contact pads 224 of semiconductor device 220 are connected to contact pads 211 on the upper surface 217 of substrate 210, using suitable methods known in the art, such as bonding wires, bumps, ball grid array (BGA) balls, in some embodiments. The substrate 210 comprises interconnect structures (not shown). Interconnect structures in substrate 210 connect to contact pads 211, which are bonded to semiconductor device 220, and contact pads 214 on opposite side of substrate 210, which are bonded to external connectors 216, in accordance with some embodiments. In an embodiment of the present disclosure, the size of the top package 200 is no greater than that of bottom package 100 (i.e., when viewed from the top, the perimeter of the top package overlaps or is contained within the perimeter of the bottom package), to facilitate the dicing process described later.

Top packages 200 are aligned with bottom packages 100 so that the locations of external connectors 216 of top packages match those of solder paste 305 on bottom packages. A second material 315, hereafter Material-2, is formed around external connectors 216 by dipping the external connectors 216 of top package into Material-2, in some embodiments. In an alternate embodiment, Material-2 may be jetted on solder paste 305 (not shown) using a jetting dispenser. Material-2 may be different from Material-1, in accordance with some embodiments. Material-2 may be a polymer with reducing agent and/or wetting agent, in some embodiments. Material-2 may be epoxy or acrylic with flux or flux with high viscosity, in accordance with some embodiments. Material-2 may facilitate the soldering process by removing oxides on solder balls and improving solder wetting, in some embodiments. Material-2 may reduce the mechanical stress experienced by inter-package connectors 320, in some embodiments.

After top packages 200 are stacked on bottom packages 100, a reflow process may performed to form inter-package connector 320. The reflow process may be performed in a commercial reflow oven and may include preheat, thermal soak, reflow, and cooling stages, in some embodiments. Material-1 and Material-2 are cured during the same reflow process, in some embodiments. The temperature of the reflow may be determined by the composition of the external connectors 216, solder paste 305, the particular PoP structure, materials used in the PoP package, and composition of Material-1 and Material-2, in some embodiments. In accordance with some embodiments, the reflow temperature ramps from room temperature to about 270° C. Other temperature profiles are also possible.

Inter-package connectors 320 may be formed by soldering together external connectors 216 of the top package with solder paste 305 formed in openings 171 on the top surface of the bottom package, in accordance with some embodiments. Inter-package connectors 320 may be copper pillars, controlled collapse chip connection (C4) bumps, or other suitable types of connectors, in accordance with some other embodiments. Inter-package connectors 320 may be located near a perimeter of the PoP package 500, in accordance with some embodiments.

The next step after the top package stacking and reflow process is the cleaning process. No figure is shown for this process. A commercial solvent may be used to clean residues generated from the reflow process, in some embodiments. For example, the Micronox or Aquanox product from Kyzen Corporation may be used for cleaning. The cleaning process may include stages such as solvent cleaning, water cleaning and wind blowing performed in a commercial cleaning tool for semiconductor manufacturing, in some embodiments. The time, speed, temperature of the cleaning process may be determined by the particular PoP structure and production requirements. For example, the peak temperature of the cleaning process is less than 100° C., in some embodiments.

Figure 19:
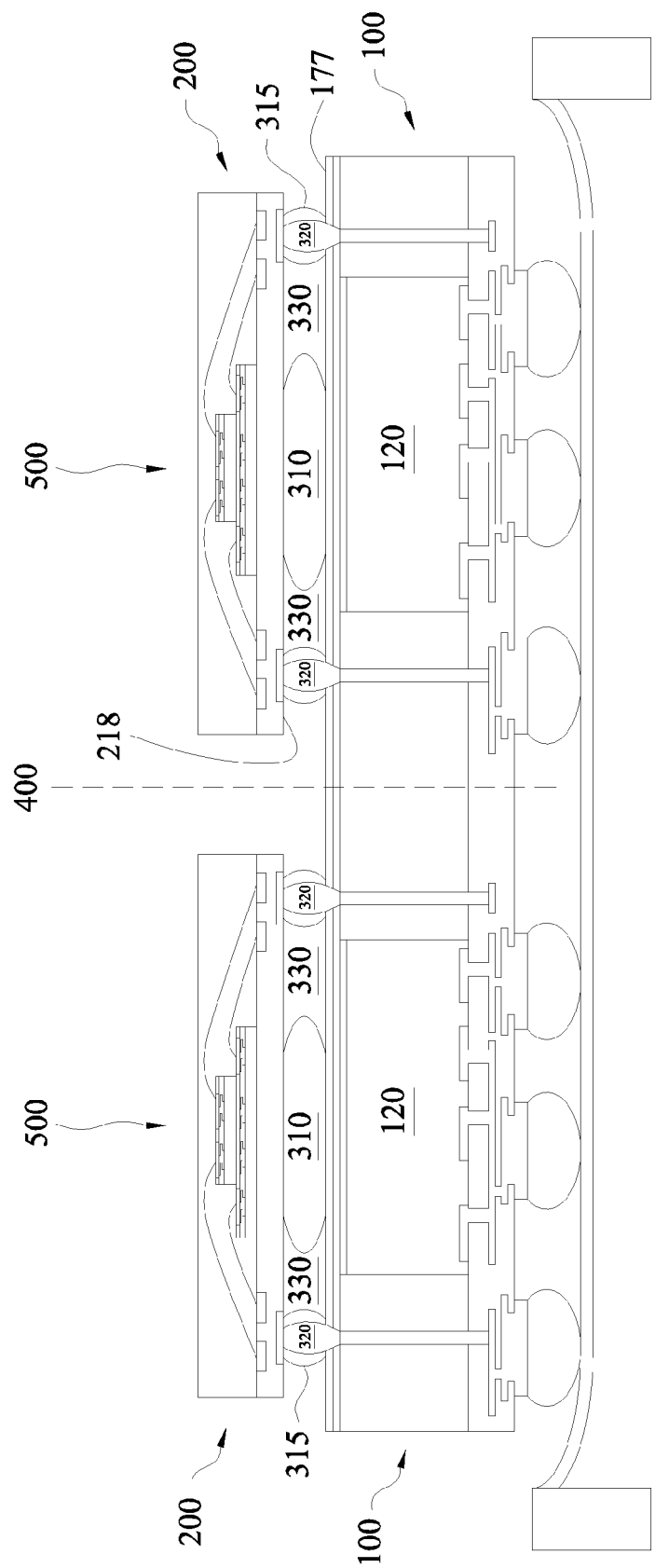

FIG. 19 shows the cross sectional view of a structure with a plurality of PoP packages 500, after the cleaning process. As shown in FIG. 19, Material-2 (label 315) surrounds and encapsulates inter-package connectors 320 and contacts the lower surface 218 of top packages 200 and the upper surface 177 of bottom packages 100. Material-2 protects and provides stress relief for inter-package connectors 320. Material-1 is located in the center area of space 330. In some embodiments, Material-1 fills up substantially 30~65% of space 330. At least center portions of Material-1 contact the lower surface 218 of top packages and the upper surface 177 of bottom packages.

FIG. 19 also illustrates a dicing process to form individual PoP packages. Dicing starts from the top package side and goes down to the bottom package side along a boundary 400 between two adjacent PoP packages 500. Dicing saw or laser cutting may be used, in some embodiments.

Figure 20:
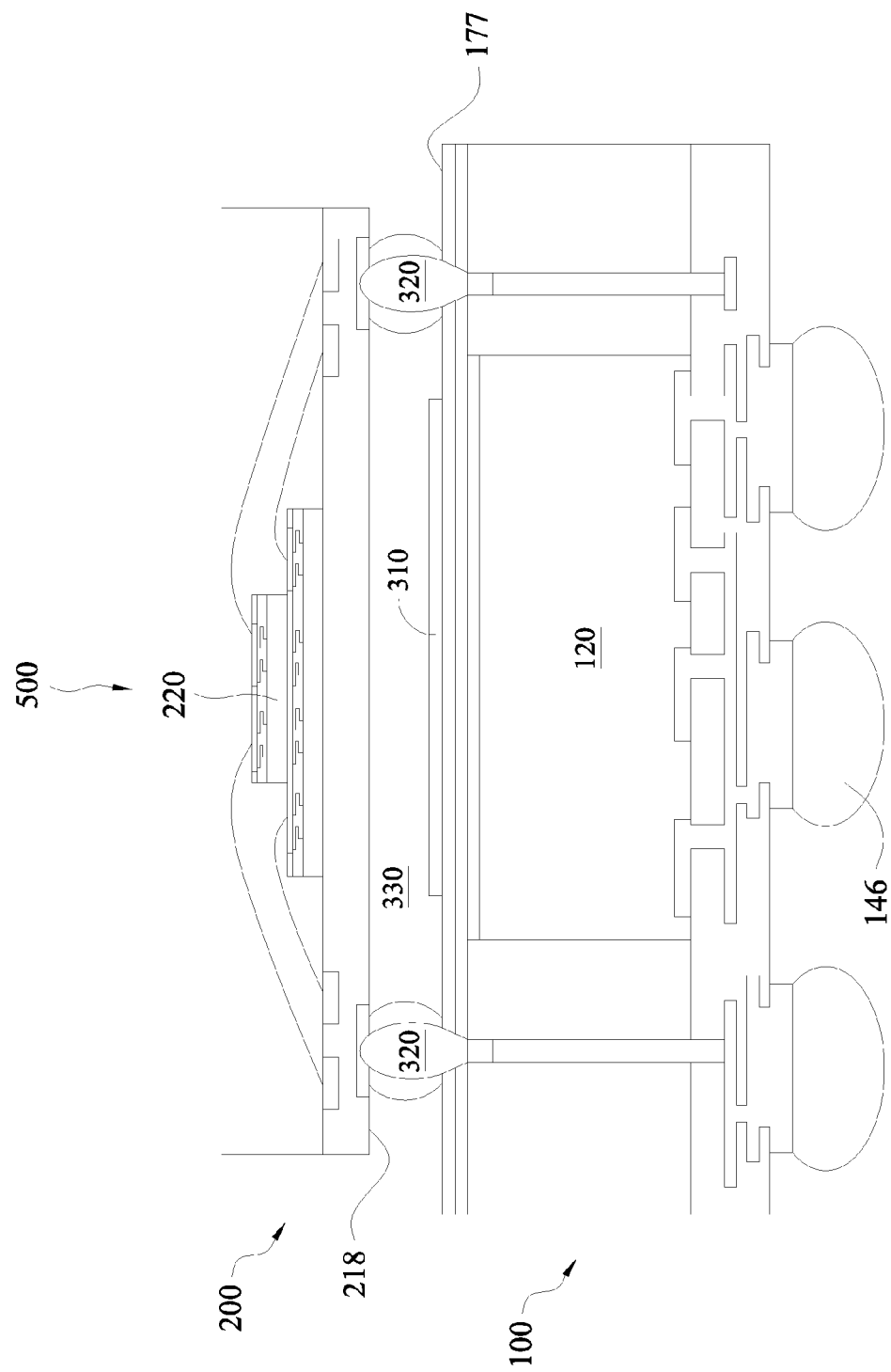
FIG. 20-21 illustrate cross sectional views of a semiconductor PoP package in accordance with other embodiments of the present disclosure.
Figure 21:
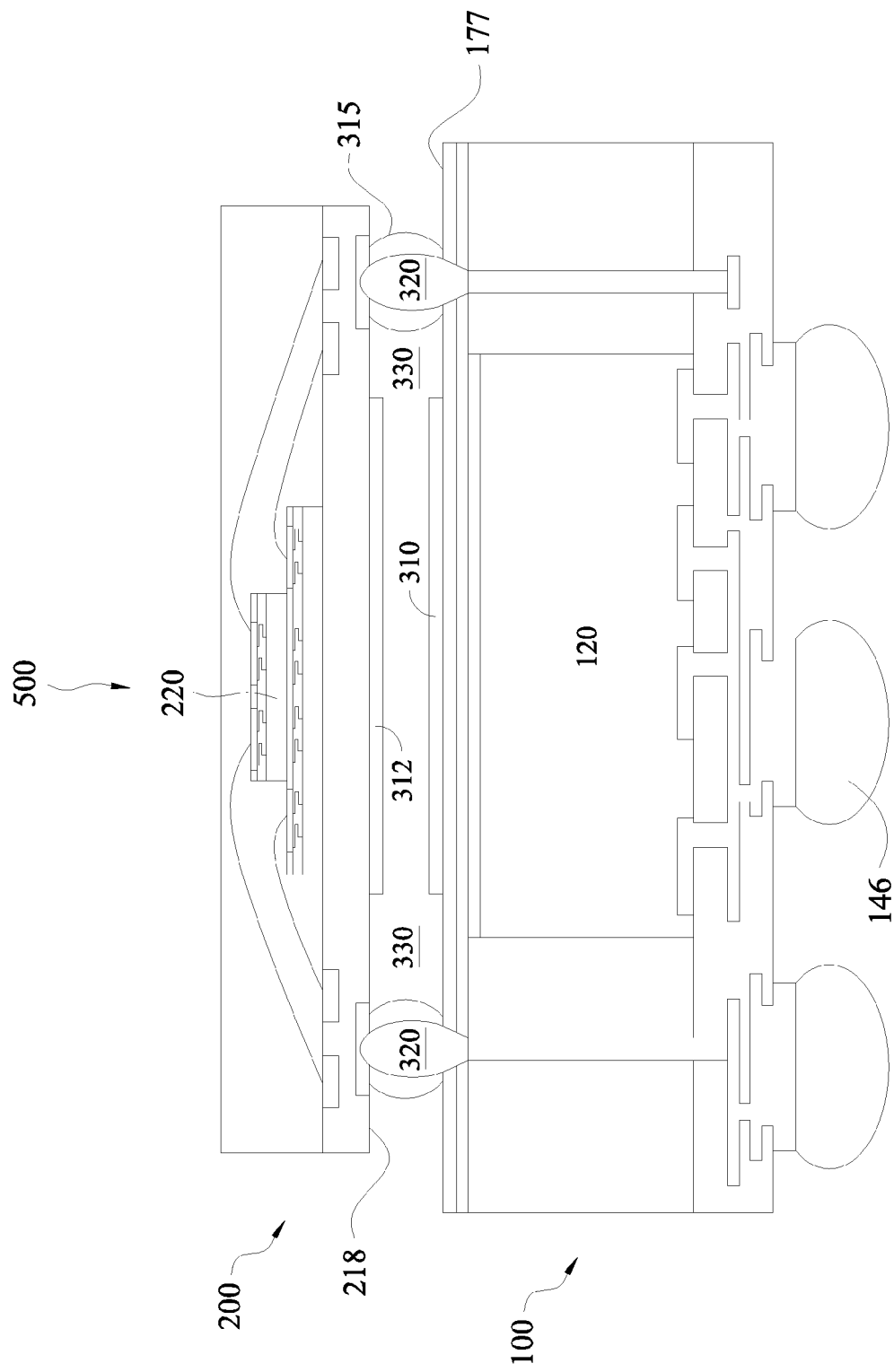

In accordance with another embodiment of the current disclosure, shown in FIG. 20, Material-1 may be in the form of a film 310 attached on the top surface 177 of bottom package 100 inside space 330. The composition of film 310 may be substantially the same as that of Material-1 shown in FIG. 1a, in some embodiments. In an alternate embodiment, film 310 may be a metal-based or a polymer-based material. For example, a copper film with adhesive may be used as Material-1 for film 310 and attached to the upper surface 177 of bottom package 100 by a thermal compression process. In yet another embodiment, as shown in FIG. 21, a first film 310 made of Material-1 is attached on the upper surface 177 of bottom package 100, and a second film 312 made of a third material (Material-3 hereafter) is attached on the lower surface 218 of top package 200. Both film 310 and film 312 may be inside space 330, in some embodiments. Film 310 and film 312 may be made of substantially the same materials, in some embodiments. Film 310 and film 312 may be made of different materials to compensate for different types of warpage experienced by the bottom package and the top package, in some other embodiments. The volume (i.e., size and thickness) and composition of the film(s) may be determined by experimental moiré pattern measurement process or computer simulations, similar to the process described above, in some embodiments.

Embodiments of the above described process for forming a PoP package may have many advantages. One advantage of is low cost and high unit-per-hour (UPH) count. Material-1 does not have to fill up the space between the top package and the bottom package completely, saving processing time and material cost. The reflow process is done once to form inter-package connectors 320 and cure Material-1 (if needed) and Material-2 at the same time. This simplifies the manufacturing process, thus saving processing time and lowering cost.

Another advantage for embodiments of the above process for forming a PoP package is good warpage performance and better reliability of the PoP structure. Due to the CTE mismatch between the different layers of materials in the package, the PoP package may experiences significant warpage. Due to the warpage, inter-package connectors 320 located near the edge of the PoP package may experience significant mechanical stress, which may lead to broken solder joints. In addition, external connectors 146 on the bottom package may lie on a significantly curved surface, making it difficult to attach the PoP package to a flat PCB board. The CTE and volume of Material-1, as well as Material-3 if applicable, can be adjusted to compensate for the warpage, as described above. With the compensating force exerted by Material-1, as well as Material-3 if applicable, the warpage of the package may be reduced considerably. This provides good warpage control. As a result, the final PoP packages are easier to handle and have better reliability and final test results.

Figure 22:
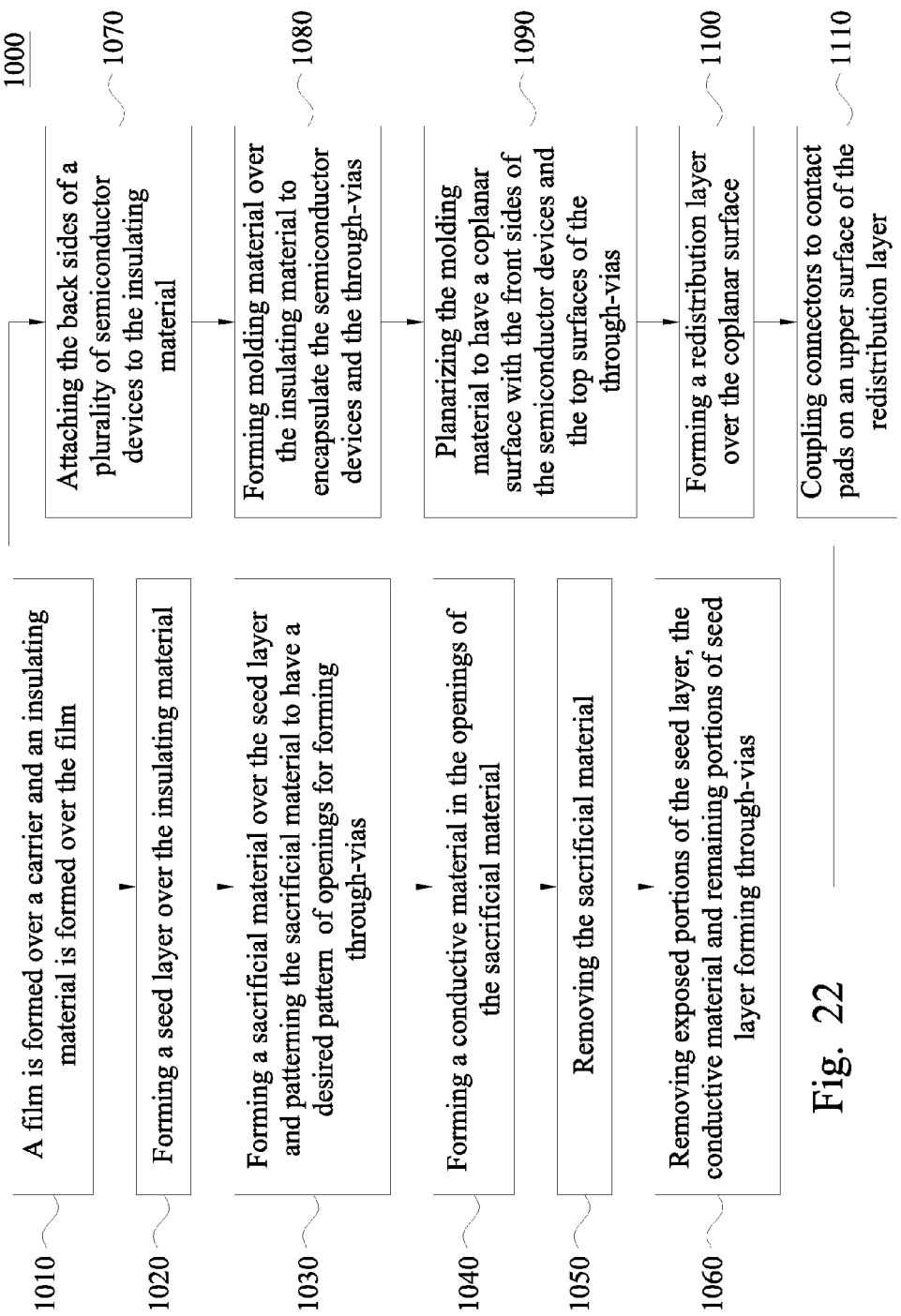
FIG. 22 illustrates a flow chart of a method for forming the structure shown in FIG. 13 in accordance with various embodiments of the present disclosure.
Figure 23:
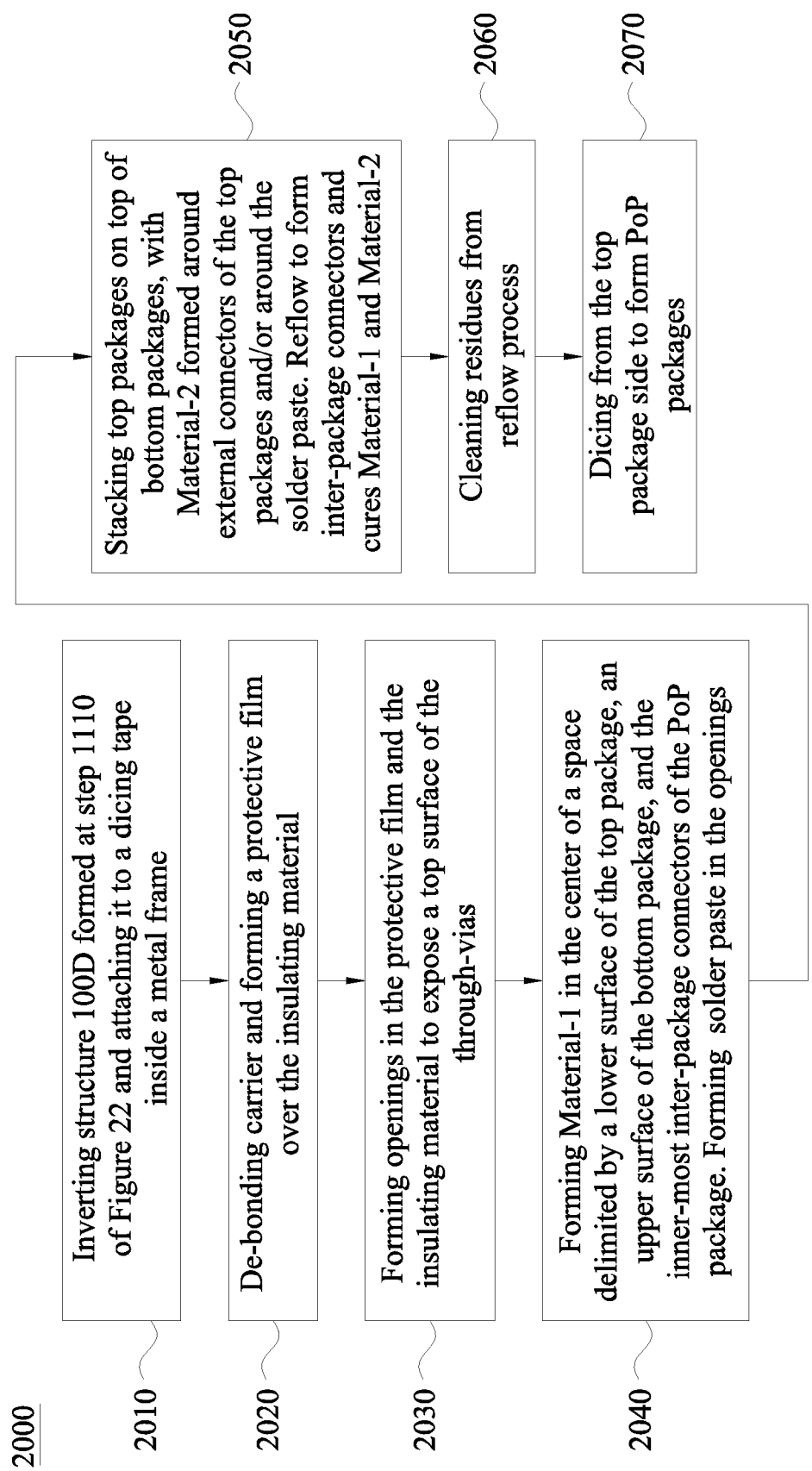
FIG. 23 illustrates a flow chart of a method for forming the PoP structure shown in FIG. 1a in accordance with various embodiments of the present disclosure.

FIG. 22 illustrates a flow chart of a method for forming a structure 100D shown in FIG. 13, in accordance with various embodiments of the present disclosure. The structure 100D is used in the first step of the flow chart in FIG. 23, which shows a method for forming the PoP semiconductor package shown in FIG. 1a, in accordance with various embodiments of the present disclosure. The flowcharts shown in FIGS. 22 and 23 are merely examples, which should not unduly limit the scope of the claims. One of ordinary skill in the art would recognize many variations, alternatives, and modifications. For example, various steps as illustrated in FIGS. 22 and 23 may be added, removed, replaced, rearranged and repeated.

Referring to FIG. 22. At step 1010, a film is formed over a carrier and an insulating material is formed over the film. At step 1020, a seed layer is formed over the insulating material. At step 1030, a sacrificial material is formed over the seed layer and patterned to have a desired pattern of openings for forming through-vias. At step 1040, a conductive material is formed in the openings of the sacrificial material. At step 1050, the sacrificial material is removed. At step 1060, exposed portions of the seed layer are removed, the conductive material and remaining portions of the seed layer form through-vias. At step 1070, the back sides of a plurality of semiconductor devices are attached to the insulating material. At step 1080, molding material is formed over the insulating material to encapsulate the semiconductor devices and the through-vias. At step 1090, the molding material is planarized to have a coplanar surface with the front sides of the semiconductor devices and the top surfaces of the through-vias. At step 1100, a redistribution layer is formed over the coplanar surface. At step 1110, connectors are coupled to contact pads on an upper surface of the redistribution layer. Structure 100D shown in FIG. 13 is formed at step 1110.

Referring to FIG. 23. At step 2010, structure 100D formed at step 1110 of FIG. 22 is inverted and attached to a dicing tape in a metal frame. At step 2020, a carrier de-bonding process is performed, and a protective film is formed over the insulating material. At step 2030, openings are formed in the protective film and the insulating material to expose a top surface of the through-vias. At step 2040, Material-1 is formed in the center of a space delimited by a lower surface of the top package, an upper surface of the bottom package, and the inner-most inter-package connectors of the PoP package. Solder paste is formed in the openings. At step 2050, top packages are stacked on top of the bottom packages, with Material-2 formed around external connectors of the top packages and/or around the solder paste. A reflow process follows to form inter-package connectors and cures Material-1 and Material-2. At step 2060, a cleaning process is performed to clean residues after the reflow process. At step 2070, dicing is performed starting from the top package side to form individual PoP packages.

In accordance with an embodiment, a semiconductor package comprises a top package and a bottom package with fan-out interconnect structures. A plurality of inter-package connectors electrically connect the top package and the bottom package, and are located near a perimeter of the semiconductor package. A first material is located in a space delimited by a lower surface of the top package, an upper surface of the bottom package, and the inner-most inter-package connectors of the semiconductor package, wherein the first material partially fills the space. A second material different from the first material encapsulates the inter-package connectors.

In accordance with an embodiment, forming a PoP structure comprises forming a bottom package with fan-out interconnect structures and attaching a top package on top of the bottom package, forming a plurality of inter-package connectors between the top package and the bottom package, wherein the inter-package connectors are located near a perimeter of the PoP package, forming a first material in a space delimited by a lower surface of the top package, an upper surface of the bottom package, and the inner-most inter-package connectors of the PoP package, wherein the first material partially fills the space, and forming a second material encapsulating the inter-package connectors, wherein the second material is different from the first material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
    a top package;
    a bottom package with fan-out interconnect structures;
    a plurality of inter-package connectors electrically connecting the top package and the bottom package and located near a perimeter of the semiconductor package;
    a first material located in a space delimited by a lower surface of the top package, an upper surface of the bottom package, and the inner-most inter-package connectors of the semiconductor package, wherein the first material partially fills the space; and
    a second material different from the first material encapsulating the inter-package connectors;
    wherein the first material is a mixture of a solute and a solvent, wherein the solute is a material selected from the group consisting of $SiO_2$, $Al_2O_3$ and $TiO_2$, and the solvent is a material selected from the group consisting of epoxy, acrylic, polypropylene, polyimide, and combinations thereof.

2. The semiconductor package of claim 1, wherein the solute constitutes 0%-50% of the first material by weight.

3. The semiconductor package of claim 1, wherein the first material is located in the center of the space and fills up substantially 30%-65% of the space.

4. The semiconductor package of claim 1, wherein the first material is in the form of a first film attached to the upper surface of the bottom package within the space, wherein the first film is spaced apart from the inter-package connectors and the lower surface of the top package.

5. The semiconductor package of claim 4, further comprising a third material in the form of a second film attached to the lower surface of the top package within the space, wherein the second film is spaced apart from the inter-package connectors, the first film, and the upper surface of the bottom package.

6. The semiconductor package of claim 1, wherein the second material comprises a material selected from the group consisting of epoxy, acrylic, a reducing agent, a wetting agent, and combinations thereof.

7. The semiconductor package of claim 1, wherein the second material contacts the lower surface of the top package and the upper surface of the bottom package.

8. The semiconductor package of claim 1, wherein the top package has a perimeter that, when viewed from the top, overlaps or is contained within a perimeter of the bottom package.

9. The semiconductor package of claim 1, wherein the first material has a first coefficient of thermal expansion (CTE) that counteracts effects of CTE mismatch of materials of at least one of the bottom package and the top package.

10. The semiconductor package of claim 5, wherein the third material has a second coefficient of thermal expansion (CTE) that counteracts effects of CTE mismatch of materials of the top package.

11. A method of forming a PoP package, comprising:
    forming a bottom package with fan-out interconnect structures;
    attaching a top package on top of the bottom package;
    forming a plurality of inter-package connectors between the top package and the bottom package, wherein the inter-package connectors are located near a perimeter of the PoP package;
    forming a first material in a space delimited by a lower surface of the top package, an upper surface of the bottom package, and the inner-most inter-package connectors of the PoP package, wherein the first material partially fills the space, wherein the first material is formed by mixing a solute with a solvent, wherein the solute is a material selected from the group consisting of $SiO_2$, $Al_2O_3$ and $TiO_2$, wherein the solvent is a material selected from the group consisting of epoxy, acrylic, polypropylene, polyimide, and combinations thereof; and
    forming a second material around the inter-package connectors, wherein the second material is different from the first material.

12. The method of claim 11, wherein the first material is formed in the center of the space and fills up substantially 30%-65% of the space, and wherein at least center portions of the first material contact the lower surface of the top package and the upper surface of the bottom package.

13. The method of claim 11, wherein the first material is formed as a first film attached to the upper surface of the bottom package within the space, wherein the first film is separated from the inter-package connectors and the lower surface of the top package.

14. The method of claim 13, further comprising forming a second film attached to the lower surface of the top package within the space, wherein the second film is separated from the inter-package connectors, the first film, and the upper surface of the bottom package.

15. The method of claim 11, wherein the second material is formed using a material selected from the group consisting of epoxy, acrylic, a reducing agent, a wetting agent, and combinations thereof, and wherein the second material contacts the lower surface of the top package and the upper surface of the bottom package.

16. A semiconductor package, comprising:
    a top package;
    a bottom package with fan-out interconnect structures connected to the top package by a plurality of conductive connectors, wherein the conductive connectors are disposed between a lower side of the top package and an upper side of the bottom package, and along a perimeter of the semiconductor package; and
    a first film attached to a first center region of the upper side of the bottom package, wherein the first center region is free of conductive connectors, wherein the first film is spaced apart from the conductive connectors and there is an empty space between an upper side of the first film and the lower side of the top package, and wherein the first film has a first coefficient of thermal expansion (CTE) that counteracts effects of CTE mismatch of materials of the bottom package.

17. The semiconductor package of claim 16, wherein the first film is a metal-based material.

18. The semiconductor package of claim 16, further comprising:
    a second film attached to a second center region of the lower side of the top package, wherein the second film is spaced apart from the conductive connectors, the first film, and the upper side of the bottom package.

19. The semiconductor package of claim 18, wherein the second film has a second coefficient of thermal expansion (CTE) that counteracts effects of CTE mismatch of materials of the top package.

20. The semiconductor package of claim 16, wherein the first film is a polymer-based material.

* * * * *